United States Patent
Ikeda et al.

(10) Patent No.: US 6,198,067 B1
(45) Date of Patent: Mar. 6, 2001

(54) PLASMA PROCESSING DEVICE FOR CIRCUIT SUPPORTS

(75) Inventors: Hiroyuki Ikeda; Shoji Shiga, both of Ushiku; Ryoichi Mori, Kukizaki-machi, all of (JP)

(73) Assignee: Nippon Mektron, Ltd., Minato-Ku (JP)

( * ) Notice: Subject to any disclaimer, the term of this patent is extended or adjusted under 35 U.S.C. 154(b) by 0 days.

(21) Appl. No.: 09/387,126

(22) Filed: Aug. 31, 1999

(30) Foreign Application Priority Data

Dec. 28, 1998 (JP) .................................................. 10-377593

(51) Int. Cl.$^7$ .................................................. B23K 10/00
(52) U.S. Cl. ............................. 219/121.43; 219/121.52; 219/121.41; 204/298.38; 204/192.32; 156/345
(58) Field of Search ........................... 219/121.4, 121.41, 219/121.43, 121.59, 121.52; 204/298.38, 298.39, 192.32; 156/345, 643.1, 646.1; 118/723 I, 723 R

(56) References Cited

U.S. PATENT DOCUMENTS

| | | | | |
|---|---|---|---|---|
| 4,633,811 | * | 1/1987 | Maruyama | 118/50.1 |
| 4,663,829 | * | 5/1987 | Hartman et al. | 29/572 |
| 4,971,667 | * | 11/1990 | Yamazaki et al. | 204/192.32 |

* cited by examiner

*Primary Examiner*—Mark Paschall
(74) *Attorney, Agent, or Firm*—Alix, Yale & Ristas, LLP

(57) ABSTRACT

Many boards 7 to be processed are disposed within a metal chamber 1 in an isolated state, and many ground electrode plates 9 are disposed near by both surfaces of the boards 7 so as to be at the same potential as the chamber 1. While a microwave generated by a magnetron 3 from an upper portion of the chamber 1 is applied in the chamber 1, both surfaces of the boards 7 are processed at a time with plasma by using glow discharges produced between the boards 7 and plates 9 due to a difference in high-frequency potential between the boards 7 and plates 9 under presence of reaction gas.

24 Claims, 5 Drawing Sheets

PLASMA PROCESSING DEVICE FOR CIRCUIT SUPPORTS

BACKGROUND OF THE INVENTION (i) Field of the Invention

The present invention relates to a device for processing circuit supports with plasma excited by a microwave, particularly to a device capable of performing plasma processing for, e.g., surface-refining or etching to both surfaces of a large number of circuit supports such as flexible circuit boards at a time.

(ii) Description of the Related Art

Plasma processing devices of microwave excitation type are used in many fields. FIG. 6 shows an example of such a device, in which a waveguide 51 is disposed at an insulator window hermetically attached to an upper portion of a quartz chamber 50. A magnetron 52 is disposed at the top of the waveguide 51. An object 54 to be processed is placed on an insulator table 53 in the quartz chamber 50. Reaction gas 55 is introduced into the quartz chamber 50 through one portion thereof while the chamber is exhausted with a vacuum pump through a vacuum exhaust port 57. The vacuum pressure in the quartz chamber 50 is checked with a pressure gauge 56, and then the magnetron 52 is energized to perform aimed plasma processing to the object 54. Plasma processing devices of this type are widely used for, e.g., etching or CVD processes for semiconductor wafers.

FIG. 7 shows another example, in which the interior of a metal chamber 60 is hermetically divided with an insulator window 62, and a magnetron 61 is disposed at the top of the chamber above the window. An object 64 to be processed is placed on an insulator table 63 in the metal chamber 60. Reaction gas 65 is introduced into the metal chamber 60 through one portion thereof while the chamber is exhausted with a vacuum pump through a vacuum exhaust port 67. The vacuum pressure in the metal chamber 60 is checked with a pressure gauge 66, and then the magnetron 61 is energized to perform aimed plasma processing to the object 64. Plasma processing devices of this type are widely used for etching processes for semiconductors, TFTs, printed-circuit boards, etc., or in other various fields for, e.g., ashing photoresist, etching, or cleaning or refining surfaces.

Such plasma processing devices as described above, however, can process only one or few objects at a time in consideration of uniformity in processing over the objects. This is because the surface of each object to be processed faces the plasma source and so their locations are restricted by the space in cross section of the chamber and the plasma distribution therein.

SUMMARY OF THE INVENTION

It is an object of the present invention to provide a device capable of performing plasma processing for, e.g., surface refining or etching to both surfaces of a large number of circuit supports such as flexible circuit boards or both surfaces of a continuous sheet of flexible circuit supports at a time in considerable parts of cross section and height of a chamber without inequality or restriction by the plasma distribution and size of a plasma source.

According to the present invention, in a plasma processing device for circuit supports in which objects to be processed are processed with plasma by applying a microwave generated by a magnetron from an upper portion of a hermetically sealed metal chamber in said metal chamber, a large number of boards to be processed are disposed within said metal chamber in an isolated state, a large number of ground electrode plates are disposed near by both surfaces of said boards so as to be at the same potential as said metal chamber, and both surfaces of said boards are processed at a time with plasma by using glow discharges produced between said boards and said ground electrode plates due to a difference in high-frequency potential between said boards and said ground electrode plates under presence of reaction gas.

It is preferable that each of said ground electrode plates is larger than each of said boards to be processed. It is suitable that each of said ground electrode plates is mesh-like or porous. Said boards to be processed can be supported through their lower end portions by a holder at predetermined intervals.

For increasing the number of boards processed at a time, it is advantageous that holders are disposed in layers within said metal chamber in an isolated state, a large number of boards to be processed are disposed on each of said holders at predetermined intervals, and a large number of ground electrode plates are disposed near by both surfaces of said boards so as to be at the same potential as said metal chamber.

The present invention can provide not only such a device as described above for rectangular boards but also a device by which both surfaces of a continuous sheet comprising a large number of divisions of flexible circuit supports can be continuously processed with plasma at a time.

In this case, a plasma processing device for circuit supports in which objects to be processed are processed with plasma by applying a microwave generated by a magnetron from an upper portion of a hermetically sealed metal chamber in said metal chamber, is basically constructed as follows: a continuous sheet of circuit supports to be processed is moved in a zigzag path through a large number of intermediate rolls vertically, a large number of ground electrode plates are disposed near by and along both sides of said path so as to be at the same potential as said metal chamber, and both surfaces of said sheet are processed at a time with plasma by using glow discharges produced between said sheet and said ground electrode plates due to a difference in high-frequency potential between said sheet and said ground electrode plates under presence of reaction gas.

DETAILED DESCRIPTION OF THE PREFERRED EMBODIMENTS

Embodiments of the present invention will be described hereinafter with reference to drawings.

Figure 1:
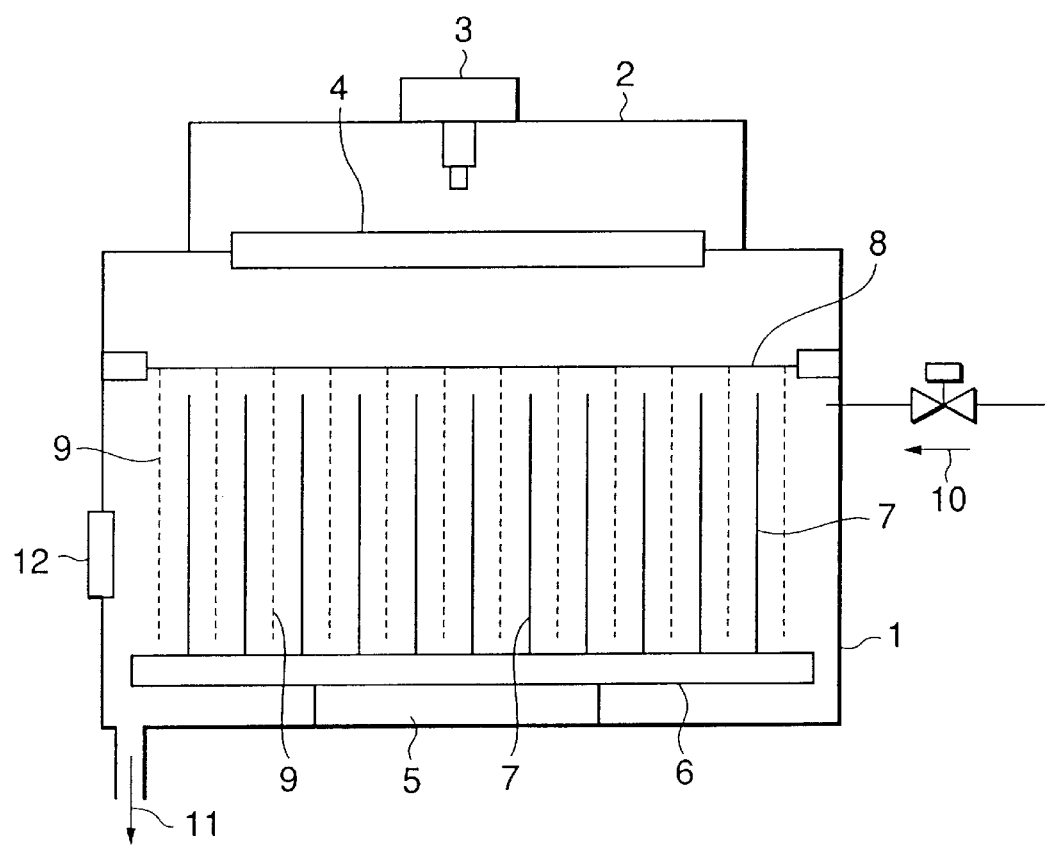
FIG. 1 is a schematic view of a plasma processing device for circuit boards according to an embodiment of the present invention.

FIG. 1 schematically shows a plasma processing device for circuit boards according to an embodiment of the present invention. A box-like chamber 1 made of metal such as aluminum or stainless steel has an upper portion into which a transmission window 4 made of an insulator such as an alumina or quartz board is hermetically fitted. A shield chamber 2 made of, e.g., aluminum is disposed so as to enclose the transmission window 4. A magnetron 3 is disposed at the top of the shield chamber 2. A microwave of an oscillated frequency of about 2.45 GHz generated in the magnetron 3 is introduced into the metal chamber 1 through the transmission window 4.

Figure 2:
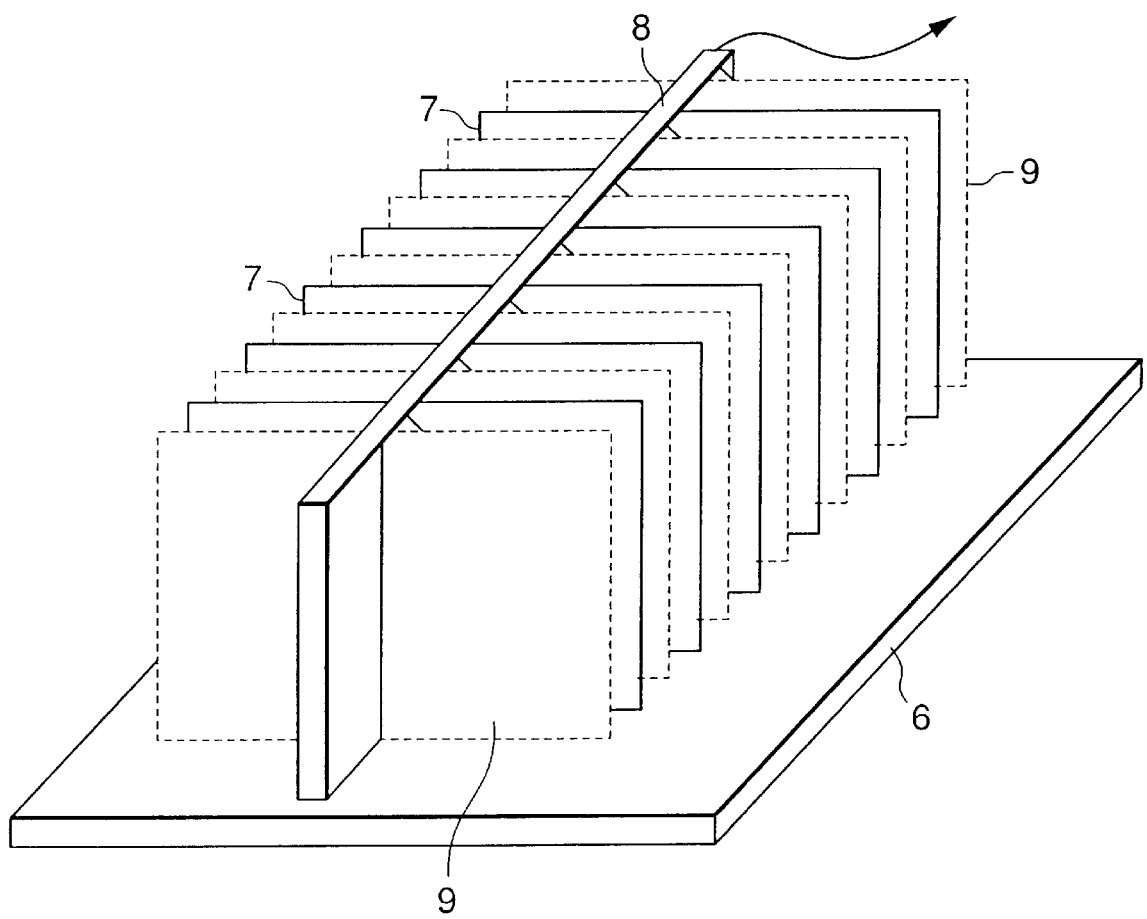
FIG. 2 is an illustrative perspective view showing a state of disposition of boards to be processed and ground electrode plates according to the present invention.

A proper insulator table 5 of, e.g., a quartz or Teflon board is disposed in the bottom portion of the metal chamber 1. The insulator table 5 is provided on its upper surface with a holder 6 of a predetermined size for supporting boards to be processed, as shown in FIG. 2 more specifically. The holder 6 is made of, e.g., aluminum. A large number of boards 7 to be processed, such as hard or flexible circuit boards, are vertically supported at their lower ends on the upper surface of the holder 6 to be disposed at predetermined intervals, by using not-shown proper grooves or the like formed on the upper surface of the holder 6.

A support frame 8 is disposed above the boards 7 at a distant. The support frame 8 is fixed to the inner wall surface of the metal chamber 1 to be at the ground potential. As shown in FIG. 2, ground electrode plates 9 made of aluminum mesh or porous plates are fixed at their upper ends to the support frame 8 and supported thereby. The ground electrode plates 9 are disposed equally in relation to both surfaces of the boards 7 to be processed. Each of the ground electrode plates 9 is so designed in size that its lower end does not come into contact with the holder 6 for supporting the boards 7 to be processed.

The metal chamber 1 can have a not-shown proper door hermetically attached to the front wall of the chamber to put in or take out the boards 7, e.g., with the holder 6.

In this device, reaction gas 10 such as mixture gas of tetrafluorocarbon and oxygen or nitrogen gas is introduced into the metal chamber 1 through one portion thereof, and the metal chamber 1 is exhausted with a vacuum pump through an exhaust port 11. While the interior of the metal chamber 1 is kept at 0.2 to 0.15 mbar, the magnetron 3 is energized to generate a microwave. Plasma in a glow discharge state is then produced in the metal chamber 1. At this time, through a monitor window 12, it can be confirmed that glow discharges occur between each pair of board 7 and ground electrode plate 9 generally over either surface of the board 7.

In such a plasma processing device for circuit boards, reaction gas forms plasma all over near either surface of each board 7, and ions and radicals thus produced develop processes for, e.g., etching an insulating base material, an adhesive layer or the like on each board 7.

In the present invention, each ground electrode plate 9 is made of a porous plate such as an aluminum mesh plate having each hole diameter of about 0.8 mm, the thickness of nearly 1 mm and the profile nearly 30% larger than that of each board 7. Such a ground electrode plate 9 affords easy occurrence of glow discharges because of presence of edges of holes or mesh. In addition, it allows reaction gas easily to enter the space between it and its opposing board 7. These effects are remarkable in case of circuit boards in each of which copper patterns are formed on both surfaces of an insulating layer. Designing each ground electrode plate 9 so as to be larger than each board 7 to be processed, as described above, can improve equality in processing when both surfaces of each board 7 are processed at a time.

When the above-described plasma processing device is used, reactions occur on the surface of an exposed insulating layer of each board 7 from both surfaces of which copper leaves or the like had been properly removed by photolithography or etching technique. In addition, by plasma of reaction gas excited, the exposed insulating layer is etched. Through-holes or via-holes can easily be formed thereby.

In processing both surfaces of each board 7 at a time, according to the construction of the above device, the high-frequency potential is the highest at the output end of the magnetron 3, the second highest at the boards 7, and the lowest at the ground electrode plates 9. There is a difference in potential between the boards 7 and ground electrode plates 9. So discharges occur in the space between each pair of board 7 and ground electrode plate 9 to produce plasma on the surface of the board 7. Such plasma processing as described above can be suitably performed thereby.

Figure 3:
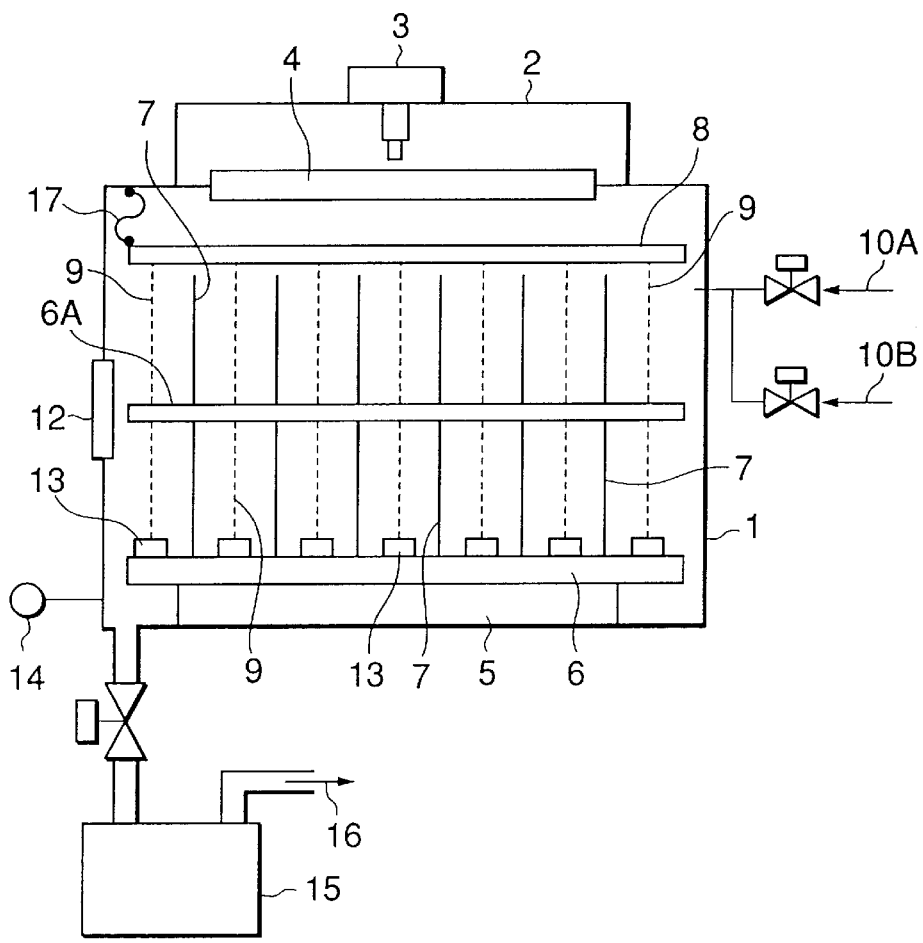
FIG. 3 is a schematic view of a plasma processing device for circuit boards according to another embodiment of the present invention.

FIG. 3 schematically shows a plasma processing device for circuit boards according to another embodiment of the present invention, in which a large number of boards 7 can be more efficiently processed with plasma by disposing the boards 7 in multilayer. In FIG. 3, the same references as in FIG. 1 denote the same components as in FIG. 1, respectively.

Referring to FIG. 3, boards 7 to be processed in the first (lower) layer are supported through their lower and upper ends by holders 6 and 6A, each of which is similar to that of the above embodiment, to be disposed at predetermined intervals. Each ground electrode plate 9 disposed near by either surface of each board 7 is supported through its lower end by an insulating spacer 13 provided on the upper surface of the holder 6, and attached at its upper end to the lower surface of the upper holder 6A.

Boards 7 to be processed in the second (upper) layer are supported through their lower ends by the upper surface portion of the holder 6A to be disposed at predetermined intervals the same as the above. Each ground electrode plate 9 disposed near by either surface of each board 7 in this second layer is supported through its lower end by the upper surface of the holder 6A, and attached at its upper end to a support frame 8 to be supported thereby. When an end of the support frame 8 is connected to a metal chamber 1 through a lead wire 17, the ground electrode plates 9 become at the same electric potential as the metal chamber 1. The end of the support frame 8 can be disconnected from the metal chamber 1.

Also in this device, for example, mixture gas of reaction gas 10A of tetrafluorocarbon and reaction gas 10B of oxygen is introduced into the metal chamber 1 through one portion thereof, like the above embodiment, and the metal chamber 1 is exhausted with a vacuum pump 15 having an exhaust port 16 to an exhaust gas processing device. While the pressure in the metal chamber 1 is monitored with a pressure gauge 14 to keep at, e.g., 0.5 to 0.15 mbar, the magnetron 3 is energized at the optimum output to generate a microwave. Both surfaces of each board 7 can thereby be processed with plasma at a time with high performance, like the above embodiment.

Here, desmearing and surface-refining in a drill hole of a circuit board will be described as an application of such a plasma processing device as shown in FIG. 1 or 3.

In general, a circuit board such as a flexible circuit board is formed into a single layer or multilayer, and an insulating resin material such as epoxy resin or polyimide resin is mostly used as the material of its insulating layer. In many cases, mechanical drill processing is used for boring a hole in such a circuit board. In case of hole diameter less than 0.3 mm, however, such mechanical drill processing becomes difficult to use. So, in such a case, laser drill processing is employed using a laser such as a carbon dioxide gas laser, a YAG laser, or an excimer laser.

When a through-hole or blind via-hole is bored by such a technique, there is a case that denaturalized material or sludge remains on the wall or bottom of the bored hole or on both of them. Since such sludge remaining causes inferior adhesion of plating or lack of contact area, it must be removed.

In a plasma processing device according to the present invention, when boards 7 to be processed are set in the device in the above-described manner, and reaction gas of, e.g., mixture gas of tetrafluorocarbon and oxygen is introduced therein to perform plasma etching, sludge having remained on the inner walls and bottoms of holes formed on both surfaces of each board 7 can easily be removed at a time in about 10 to 15 minutes.

Next, an etching and boring process for such circuit boards will be described as another application. For example, in order to attain a highly efficient etching and boring process, the rate in mixture of tetrafluorocarbon gas to oxygen gas and the pressure at reaction can be varied. When holes are bored in both surfaces of each board 7 at a time, by controlling the distance between each pair of board 7 and ground electrode plate 9, equality for both surfaces of each of the board 7 and ground electrode plate 9 and etching rate to both surfaces can be varied.

By such a control, inequality in, e.g., etching depth in either surface of each board 7 can be suppressed within ±15% in case of 300 mm square circuit board. Inequality in etching rate between both surfaces of each circuit board can be suppressed to about 10 to 20%. But, if no ground electrode plate 9 is disposed, there arises a difference of 1:3 to 1:5.

Figure 4:
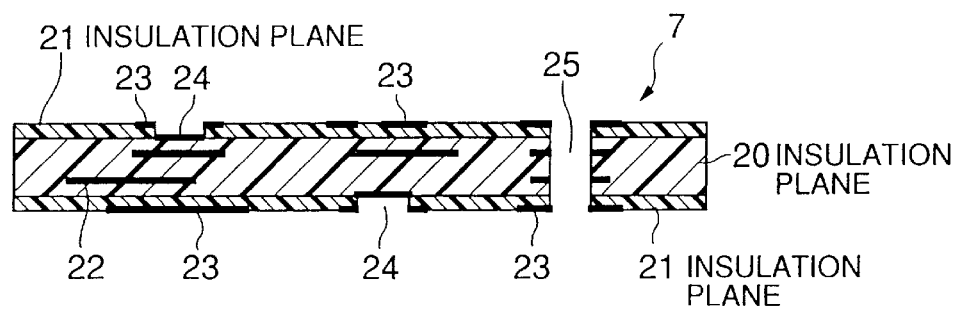
FIG. 4 is a schematic sectional view of a board to be processed.

FIG. 4 schematically shows a section of a board 7 processed as the above. Inner and surface wiring layers 22 and 23 are formed at need to a circuit board provided with inner and surface insulating layers 20 and 21. Blind via-holes 24 and a through-hole 25 are formed by removing parts of the insulating layers exposed in the surface wiring layers 23. With a device of the present invention, sludge or the like remaining on the inner walls or bottoms of the blind via-holes 24 and through-hole 25 can be suitably removed, and, e.g., refining the surfaces of the holes can be performed as described above.

Figure 5:
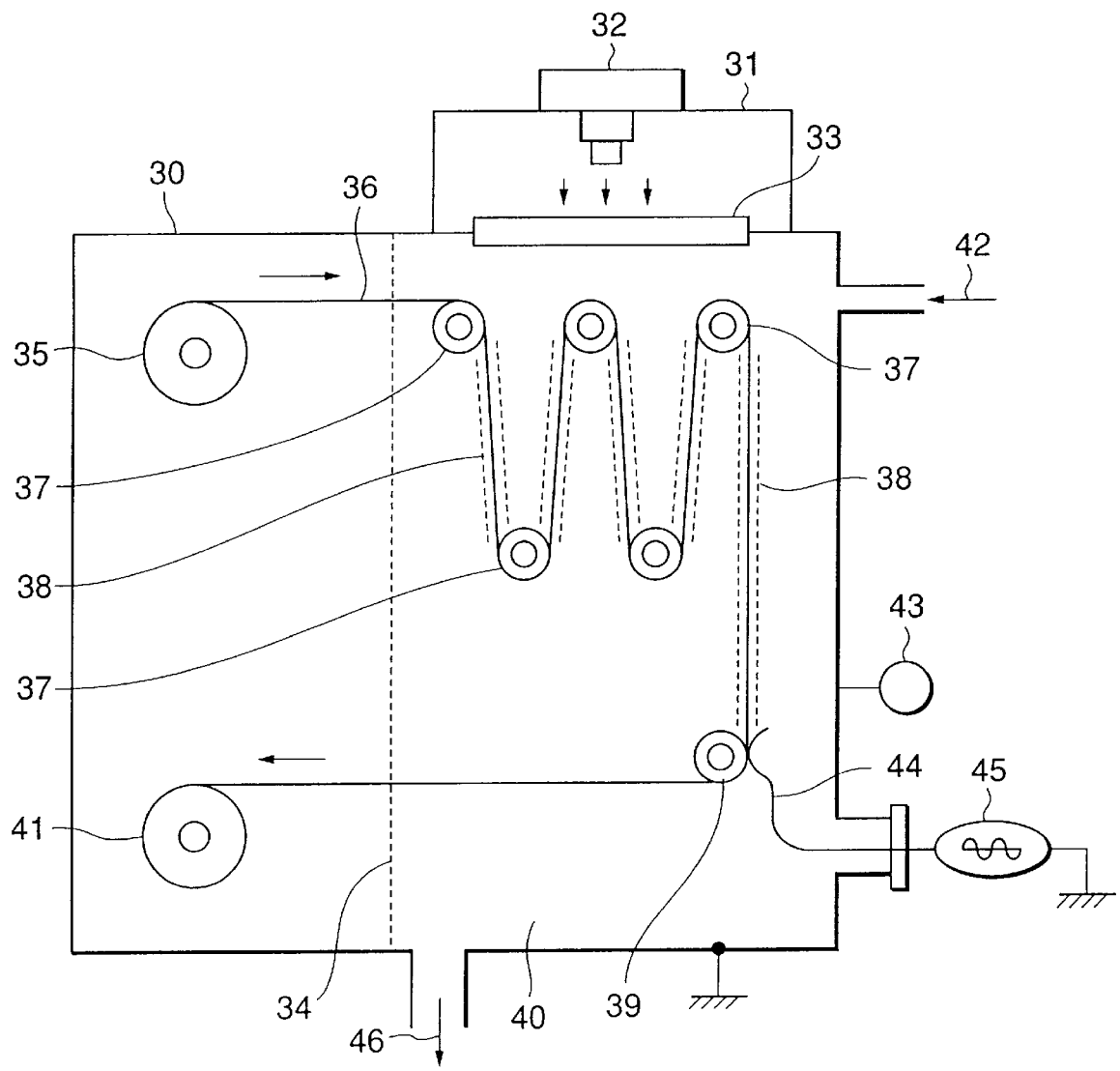
FIG. 5 is a schematic view of a plasma processing device for circuit supports according to still another embodiment of the present invention.
Figure 6:
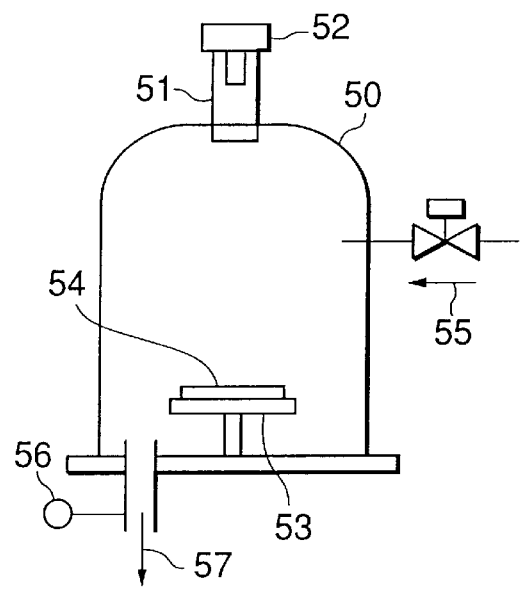
FIG. 6 is a schematic view of a plasma processing device of a prior art.
Figure 7:
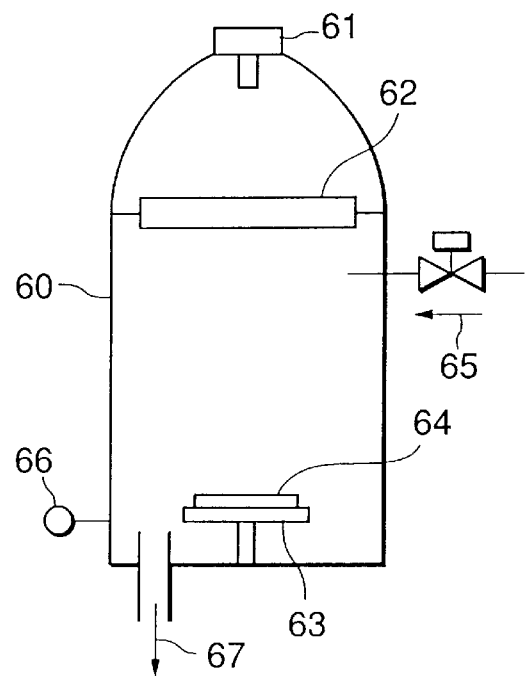
FIG. 7 is a schematic view of a plasma processing device of another prior art.

FIG. 5 schematically shows a plasma processing device according to another embodiment of the present invention, in which both surfaces of a continuous sheet comprising a large number of divisions of flexible circuit supports can be continuously processed with plasma at a time like the above embodiments.

Referring to FIG. 5, a metal shield chamber 31 is disposed on the upper right portion of the nearly central portion of a box-like metal chamber 30, like the above embodiments. A magnetron 32 is disposed at the top of the shield chamber 31. An insulating transmission window 33 made of, e.g., an alumina or quartz board is provided in a hermetic manner between the shield and metal chambers 31 and 30.

A shield plate 34 capable of screening microwaves is disposed at a proper place on the left of the region wherein a microwave is applied from the magnetron 32. A supply roll 35 is disposed in the upper left portion of the space divided by the shield plate 34. A continuous sheet 36 comprising a large number of divisions of flexible circuit supports and set on the supply roll 35 is introduced through the shield plate 34 into a plasma processing part 40. The continuous sheet 36 then passes through intermediate rolls 37 disposed zigzag in the plasma processing part 40, and, after passing a turning roll 44, it is continuously taken up by a take-up roll 41 disposed below the supply roll 35.

Ground electrode plates 38 made of aluminum mesh or porous plates at the same potential as the metal chamber 30 are disposed on both sides of the zigzag path of the continuous sheet 36 in the plasma processing part 40. The continuous sheet 36 is thereby processed with plasma like the above embodiments while it is running.

Also in this device, reaction gas 42 such as mixture gas of tetrafluorocarbon and oxygen or nitrogen gas is introduced into the plasma processing part 40 of the metal chamber 30 through one portion thereof, like the above embodiment, and the metal chamber 30 is exhausted with a vacuum pump through an exhaust port 46. While the pressure in the plasma processing part 40 of the metal chamber 30 is monitored with a pressure gauge 43 to keep at 0.2 to 0.15 mbar, the magnetron 32 is energized to generate a microwave. Plasma in a glow discharge state is then produced between the continuous sheet 36 and each ground electrode plate 38 in the plasma processing part 40 of the metal chamber 30.

While the continuous sheet 36 is continuously moved zigzag in the plasma processing part 40 in such a state, various sorts of plasma processing such as boring, desmearing, surface-refining or surface-cleaning can be performed to the continuous sheet 36 with high efficiency.

In this case, the optimum processing speed to the continuous sheet 36 can be set by controlling the operation pressure in the plasma processing part 40, the distance between the continuous sheet 36 and each ground electrode plate 38, or the like, in addition to the feeding speed of the continuous sheet 36, the oscillation output of the magnetron 32, and the flow rate of reaction gas 42 and the mixing rate therein.

When a voltage of a high frequency of, e.g., 40 to 400 kHz is applied between the continuous sheet 36 and each ground electrode plate 38 from a bias source 45 through a bias lead plate 44, production of glow discharges between the continuous sheet 36 and each ground electrode plate 38 can be promoted. It is thereby possible to improve the etching rate and also equality in surface of etching to the continuous sheet 36.

It is also possible to change the etching characteristics from isotropy to anisotropy by changing connections between the higher potential terminal of the output terminals in the bias source 45 and the ground electrode plates 38.

According to a plasma processing device for circuit supports of the present invention, a ground electrode plate is disposed near by either surface of each of a large number of rectangular boards or a continuous sheet to be processed. It is thereby possible to perform various sorts of plasma processing such as boring, desmearing, surface-refining or surface-cleaning to both surfaces of each board or the continuous sheet with high efficiency.

Besides, the device construction is simple so such plasma processing to the boards or sheet can be stably performed at lower setup cost.

What is claimed is:

1. A plasma processing device for circuit supports in which objects to be processed are processed with plasma by applying a microwave generated by a magnetron from an upper portion of a hermetically sealed metal chamber in said metal chamber, wherein a large number of boards to be processed are disposed within said metal chamber in an isolated state, a large number of ground electrode plates are disposed near by both surfaces of said boards so as to be at the same potential as said metal chamber, and both surfaces of said boards are processed at a time with plasma by using glow discharges produced between said boards and said ground electrode plates due to a difference in high-frequency potential between said boards and said ground electrode plates under presence of reaction gas.

2. A plasma processing device for circuit supports according to claim 1, wherein each of said ground electrode plates is larger than each of said boards to be processed.

3. A plasma processing device for circuit supports according to claim 1, wherein each of said ground electrode plates is mesh-like or porous.

4. A plasma processing device for circuit supports according to claim 2, wherein each of said ground electrode plates is mesh-like or porous.

5. A plasma processing device for circuit supports according to claim 1, wherein said boards to be processed are supported through their lower end portions by a holder at predetermined intervals.

6. A plasma processing device for circuit supports according to claim 2, wherein said boards to be processed are supported through their lower end portions by a holder at predetermined intervals.

7. A plasma processing device for circuit supports according to claim 3, wherein said boards to be processed are supported through their lower end portions by a holder at predetermined intervals.

8. A plasma processing device for circuit supports according to claim 4, wherein said boards to be processed are supported through their lower end portions by a holder at predetermined intervals.

9. A plasma processing device for circuit supports in which objects to be processed are processed with plasma by applying a microwave generated by a magnetron from an upper portion of a hermetically sealed metal chamber in said metal chamber, wherein holders are disposed in layers within said metal chamber in an isolated state, a large number of boards to be processed are disposed on each of said holders at predetermined intervals, a large number of ground electrode plates are disposed near by both surfaces of said boards so as to be at the same potential as said metal chamber, and both surfaces of said boards are processed at a time with plasma by using glow discharges produced between said boards and said ground electrode plates due to a difference in high-frequency potential between said boards and said ground electrode plates under presence of reaction gas.

10. A plasma processing device for circuit supports according to claim 9, wherein each of said ground electrode plates is larger than each of said boards to be processed.

11. A plasma processing device for circuit supports according to claim 9, wherein each of said ground electrode plates is mesh-like or porous.

12. A plasma processing device for circuit supports according to claim 10, wherein each of said ground electrode plates is mesh-like or porous.

13. A plasma processing device for circuit supports in which objects to be processed are processed with plasma by applying a microwave generated by a magnetron from an upper portion of a hermetically sealed metal chamber in said metal chamber, wherein a continuous sheet of circuit supports to be processed is moved in a zigzag path through a large number of intermediate rolls vertically, a large number of ground electrode plates are disposed near by and along both sides of said path so as to be at the same potential as said metal chamber, and both surfaces of said sheet are processed at a time with plasma by using glow discharges produced between said sheet and said ground electrode plates due to a difference in high-frequency potential between said sheet and said ground electrode plates under presence of reaction gas.

14. A plasma processing device for circuit supports according to claim 13, wherein supply and take-up rolls for said sheet to be processed are disposed in an end portion of said metal chamber.

15. A plasma processing device for circuit supports according to claim 13, wherein a. plasma processing part is divided within said metal chamber by a shield plate.

16. A plasma processing device for circuit supports according to claim 14, wherein a plasma processing part is divided within said metal chamber by a shield plate.

17. A plasma processing device for circuit supports according to claim 13, wherein a high-frequency electric power is applied between said sheet and said ground electrode plates.

18. A plasma processing device for circuit supports according to claim 14, wherein a high-frequency electric power is applied between said sheet and said ground electrode plates.

19. A plasma processing device for circuit supports according to claim 15, wherein a high-frequency electric power is applied between said sheet and said ground electrode plates.

20. A plasma processing device for circuit supports according to claim 16, wherein a high-frequency electric power is applied between said sheet and said ground electrode plates.

21. A plasma processing device for circuit supports according to claim 17, wherein connection between a high potential output terminal of output terminals of a bias source for applying said high-frequency electric power and said ground electrode plates is changeable.

22. A plasma processing device for circuit supports according to claim 18, wherein connection between a high potential output terminal of output terminals of a bias source for applying said high-frequency electric power and said ground electrode plates is changeable.

23. A plasma processing device for circuit supports according to claim 19, wherein connection between a high potential output terminal of output terminals of a bias source for applying said high-frequency electric power and said ground electrode plates is changeable.

24. A plasma processing device for circuit supports according to claim 20, wherein connection between a high potential output terminal of output terminals of a bias source for applying said high-frequency electric power and said ground electrode plates is changeable.

* * * * *